United States Patent
Tsai et al.

(10) Patent No.: US 7,091,535 B2
(45) Date of Patent: Aug. 15, 2006

(54) HIGH VOLTAGE DEVICE EMBEDDED NON-VOLATILE MEMORY CELL AND FABRICATION METHOD

(75) Inventors: Hung-Chih Tsai, Kaohsiung (TW); Chien-Chih Chou, Jhubei (TW); Ying-Ting Chang, Taichung (TW); Che-Jung Chu, Hsinchu (TW); Kuo-Chio Liu, Hsinchu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/793,972

(22) Filed: Mar. 5, 2004

(65) Prior Publication Data

US 2005/0194647 A1   Sep. 8, 2005

(51) Int. Cl.
*H01L 29/80* (2006.01)
(52) U.S. Cl. ............... 257/285; 257/286; 257/287
(58) Field of Classification Search ......... 257/335, 257/328, 377, 285
See application file for complete search history.

(56) References Cited

U.S. PATENT DOCUMENTS

| | | | |
|---|---|---|---|
| 4,442,591 A | 4/1984 | Haken | 29/571 |
| 4,613,385 A | 9/1986 | Thomas et al. | 148/12 B |
| 5,578,855 A | 11/1996 | Gaffur et al. | 257/371 |
| 5,650,658 A | 7/1997 | Beasom | 257/409 |
| 5,698,457 A | 12/1997 | Noguchi | 437/29 |
| 5,747,850 A * | 5/1998 | Mei | 257/328 |
| 5,976,923 A * | 11/1999 | Tung | 438/228 |
| 6,037,632 A * | 3/2000 | Omura et al. | 257/341 |
| 6,063,674 A | 5/2000 | Yang et al. | 438/286 |
| 6,087,211 A | 7/2000 | Kalnitsky et al. | 438/232 |
| 6,563,171 B1 | 5/2003 | Disney | 257/342 |
| 6,635,925 B1 * | 10/2003 | Taniguchi et al. | 257/335 |
| 2002/0025632 A1 * | 2/2002 | Hayashi et al. | 438/275 |
| 2002/0145173 A1 * | 10/2002 | Carpenter et al. | 257/500 |
| 2004/0056312 A1 * | 3/2004 | Asada et al. | 257/368 |

OTHER PUBLICATIONS

Admitted Prior Art, 2 sheets.

* cited by examiner

*Primary Examiner*—Tu-Tu Ho

(57) ABSTRACT

A high voltage PMOS device having an improved breakdown voltage is achieved. An asymmetrical high voltage integrated circuit structure comprises a gate electrode on a substrate and source and drain regions within the substrate on either side and adjacent to the gate electrode wherein the source region is encompassed by an n-well. A symmetrical high voltage integrated circuit structure comprises a gate electrode on a substrate, source and drain regions within the substrate on either side and adjacent to the gate electrode, and an n-well in the substrate underlying the gate electrode. The n-well in both structures shifts the breakdown point from the silicon surface to the bottom of the source or drain regions.

26 Claims, 1 Drawing Sheet ated circuit structure is achieved. An n-well is formed within a substrate in a source area and in the substrate underlying the gate electrode. A high voltage p-well is formed within the substrate in a drain area. Isolation regions are formed in and on the substrate. A gate electrode is formed overlying the substrate and one of the isolation regions. A source region is implanted within the n-well adjacent to the gate electrode. A drain region is implanted within the high voltage p-well adjacent to the gate electrode to complete fabrication of a high voltage integrated circuit structure.

HIGH VOLTAGE DEVICE EMBEDDED NON-VOLATILE MEMORY CELL AND FABRICATION METHOD

BACKGROUND of the INVENTION

1. Field of Invention

This invention is directed to a method of fabricating a high voltage PMOS device and more particularly to a method of fabricating a high voltage PMOS device having n-type source side doping in the manufacture of integrated circuits.

2. Description of Related Art

High voltage PMOS (HVPMOS) devices have a high breakdown voltage. There are two major challenges with HVPMOS devices. One is that the process window is not large enough. The overlay between the P-well and the active area must be at least 0.6 µm. Another challenge is in achieving a high enough breakdown voltage, for example, as much as 40 volts for a p-substrate wafer.

U.S. Pat. No. 5,578,855 to Gauffer et al describes a high voltage device having source and drain within an n-well and a p-field extension below the drain. U.S. Pat. No. 4,442,591 to Haken shows a high voltage device having both a source and a drain within a p-well and within an n-tank. U.S. Pat. No. 6,087,211 to Kalnitsky et al discloses a CMOS device having both low voltage and high voltage transistors. U.S. Pat. No. 5,650,658 to Beasom teaches tuning an n-well to form a drift region. There is an overlay between the n-well and p-well regions. U.S. Pat. No. 6,563,171 to Disney shows a high voltage PMOS device where everything in formed in an n-well. This patent also shows a high voltage NMOS device having the drain in an n-well and the source outside of the n-well. U.S. Pat. No. 6,063,674 to Yang discloses n-wells within p-wells. The source is in one n-well and the drain is in a second n-well. U.S. Pat. No. 5,698,457 to Noguchi shows a high voltage PMOS device having the drain in a p-well and the source in an n-well formed in the bottom surface of a p-well.

SUMMARY OF THE INVENTION

It is the object of this invention to provide a high voltage PMOS device having improved breakdown voltage.

Another object is to provide a high voltage PMOS device having an increased process window and increased breakdown voltage.

A further object is to provide a high voltage PMOS device having its source embedded in an n-well.

Yet another object of the invention is to provide a high voltage PMOS device having an n-well within the channel region and high voltage p-wells encompassing adjacent source and drain regions.

In accordance with the foregoing and other objects of the present invention, a high voltage device having an improved breakdown voltage is achieved. An asymmetrical high voltage integrated circuit structure comprises a gate electrode on a substrate and source and drain regions within the substrate on either side and adjacent to the gate electrode wherein the source region is encompassed by an n-well.

Also in accordance with the objects of the invention, a high voltage device having an improved breakdown voltage is achieved. A symmetrical high voltage integrated circuit structure comprises a gate electrode on a substrate, source and drain regions within the substrate on either side and adjacent to the gate electrode, and an n-well in the substrate underlying the gate electrode.

Also in accordance with the objects of the invention, a method for fabricating an asymmetrical high voltage integrated circuit structure is achieved. An n-well is formed within a substrate in a source area and in the substrate underlying the gate electrode. A high voltage p-well is formed within the substrate in a drain area. Isolation regions are formed in and on the substrate. A gate electrode is formed overlying the substrate and one of the isolation regions. A source region is implanted within the n-well adjacent to the gate electrode. A drain region is implanted within the high voltage p-well adjacent to the gate electrode to complete fabrication of a high voltage integrated circuit structure.

Also in accordance with the objects of the invention, a method for fabricating a symmetrical high voltage integrated circuit structure is achieved. An n-well is formed within a substrate in a channel area. A high voltage p-well is formed within the substrate in a drain area wherein the drain area is located on one side of the channel region. A high voltage p-well is formed within the substrate in a source area wherein the source area is located on the other side of the channel region. Isolation regions are formed in and on said substrate. A gate electrode is formed overlying the substrate and one the isolation region on either end and overlying the channel area. A source region is implanted within the high voltage p-well in the source area adjacent to the gate electrode. A drain region is implanted within the high voltage p-well in the drain area adjacent to the gate electrode to complete fabrication of a symmetrical high voltage integrated circuit structure.

BRIEF DESCRIPTION OF THE DRAWINGS

In the accompanying drawings forming a material part of this description, there is shown.

DETAILED DESCRIPTION of THE PREFERRED EMBODIMENTS

Figure 1:
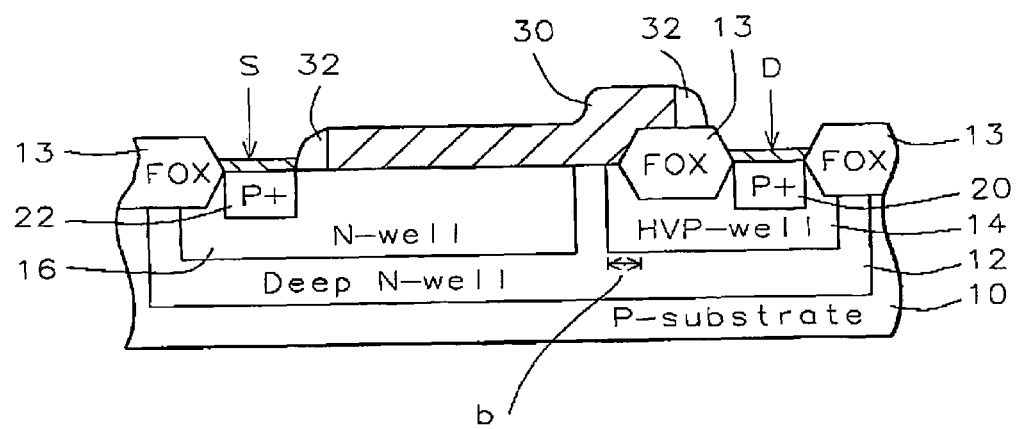
FIG. 1 is a schematic cross-sectional representation of a first preferred embodiment of the present invention.
Figure 2:
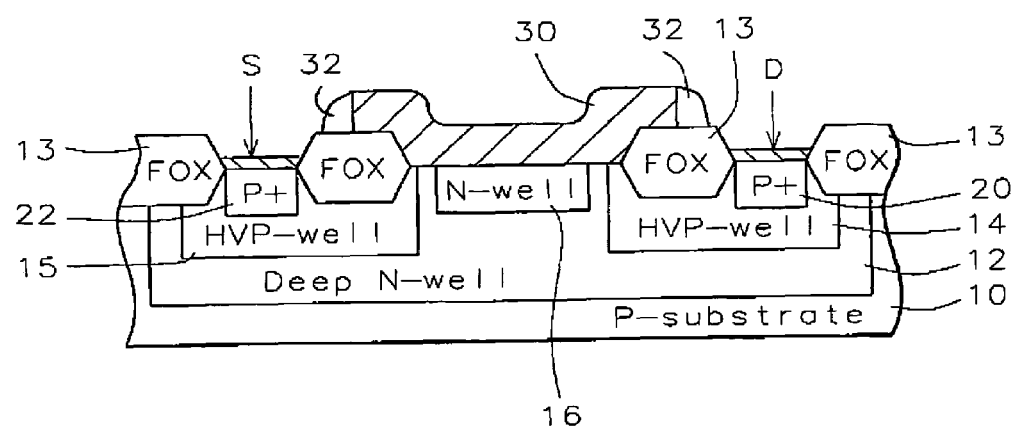
FIG. 2 is a schematic cross-sectional representation of a second preferred embodiment of the present invention.

The present invention provides a device and fabrication method for an improved high voltage PMOS device, providing an enlarged process window and an increased device breakdown voltage. This is achieved by inserting an extra n-well in the source side and the substrate underlying the gate electrode of the high voltage PMOS device to improve HV device breakdown. The process of the present invention is fully compatible with the conventional process without increased process cost. Two preferred embodiments of the present invention will be described. FIG. 1 shows an asymmetrical high voltage device while FIG. 2 shows a symmetrical device.

FIG. 1 is an illustration of an asymmetrical PMOS structure. P-substrate 10 is shown. Deep n-well 12 has been formed within the substrate. Isolation regions such as field oxide (FOX) regions 13 are formed in and on the substrate to separate active areas. A high voltage P-well 14 is typically formed in the drain side of the device. P+ source 22 (S) and drain 20 (D) are implanted into the substrate within the deep n-well. The source and drain are typically silicided as shown. Gate 30 is shown with dielectric sidewalls 32. The value b is the overlap dimension of the polysilicon gate 30 to the high voltage p-well 14. The overlap process window is influenced by process fluctuations, including lithography, implantation, and thermal diffusion processes. A process window of 0.6 μm is necessary for manufacturing. In the process of the present invention, the process window is improved from 0.5 to 0.9 μm.

The process of the invention adds an n-well 16 in the source side and the substrate underlying the gate electrode of the device as shown. The source diffusion 22 is completely within the n-well 16. No additional processing steps are required to form this n-well. The n-well mask is to be opened at this position for the n-well 16. The presence of the n-well 16 will enhance the re-surface effect and shift the breakdown voltage from the silicon surface to the junction bottom. This will increase the breakdown voltage, for example, by 5–10 volts for a 0.35 flash embedded high voltage device. The breakdown voltage change will improve the reliability of the device by reducing hot carrier effects. This shift also reduces the electron field in the silicon surface, thus improving the hot carrier effect as well. The process of the invention can reduce the high voltage device dimension since a longer channel length to reduce breakdown voltage is not required. It is easy to tune the threshold voltage by n-well dosage.

It is not desirable to put the drain within an n-well, as is done in some of the prior art. N-doping in the field oxide and drain region will cause the field oxide to pile up phosphorus. In addition, the n-type doping will consume the p-type areas causing damage to the electron field structure and resulting in low breakdown voltage.

FIG. 2 is an illustration of a symmetrical PMOS structure. P-substrate 10 is shown. Deep n-well 12 has been formed within the substrate. Isolation regions such as field oxide (FOX) regions 13 are formed in and on the substrate to separate active areas. In the symmetrical device, high voltage P-wells 14 and 15 are formed on both sides of the device. In the symmetrical device, both source and drain sides can operate at high voltage. It is more flexible for circuit design.

P+ source 22 (S) and drain 20 (D) are implanted into the substrate within the high voltage p-wells. The source and drain are typically silicided as shown. Gate 30 is shown with dielectric sidewalls 32. In this embodiment as well, the preferred overlay between the gate and the high voltage (HV) p-well is 0.6 μm.

The process of the invention adds an n-well 16 within the channel under the gate as shown. The n-well in the substrate and underlying the gate electrode between the source and drain will enhance the re-surface effect and shift the breakdown point from the silicon surface to the junction bottom. The n-well provides for threshold voltage tuning. The n-well allows for a shorter channel under the gate and can reduce the channel length by about 20%.

No additional processing steps are required to form this n-well. The n-well mask is to be opened at this position for the n-well 16. The presence of the n-well 16 will shift the breakdown voltage from the silicon surface to the junction bottom. This will increase the breakdown voltage, for example, by 5–10 volts for a 0.35 flash embedded high voltage device. The breakdown voltage change will improve the reliability of the device by reducing hot carrier effects.

The process of the present invention improves breakdown voltage of a high voltage PMOS device by 1) embedding the source in an additional n-well in an asymmetric structure or by 2) adding an n-well under the gate electrode between the source and drain regions. These n-wells cause the breakdown points to shift from the silicon surface to the bottom of the junction, thus increasing breakdown voltage.

While the present invention has been particularly shown and described with reference to the preferred embodiment thereof, it will be understood by those skilled in the art that various changes in form and detail may be made without departing from the spirit and scope of the invention.

What is claimed is:

1. A high voltage integrated circuit structure comprising:
    a gate electrode over a substrate;
    source and drain regions within the substrate on opposite sides of, and adjacent to, the gate electrode;
    a deep n-well within the substrate;
    an n-well located within the deep n-well and at least partially under the gate electrode, the n-well extending up to a top surface of the substrate;
    a drain high voltage p-well within said substrate, and
    an isolation region partially underlying an end of said gate electrode, said isolation region partially underlying said gate electrode on said side of said gate electrode having said drain region, said drain region lying within the drain high voltage p-well,
    wherein said gate electrode overlies and directly contacts a portion of the drain high voltage p-well where the isolation region does not overlie the drain high voltage p-well, and
    the isolation region is located so that the drain high voltage p-well underlies the isolation region entirely.

2. The structure of claim 1, wherein the n-well does not underlie the drain region.

3. The structure of claim 2, the drain high voltage p-well is within the deep n-well and underlying the drain region.

4. The structure of claim 1, wherein:
    the structure is asymmetrical,
    said source region is encompassed by the n-well, and wherein said drain region is not encompassed by said n-well.

5. The structure according to claim 4 wherein said structure is a high voltage PMOS device.

6. The structure according to claim 4 wherein said source and drain regions are silicided.

7. The structure according to claim 4 wherein said source and drain regions lie within said deep n-well.

8. The structure according to claim 4 wherein a breakdown voltage of said device occurs at the bottom of said drain region.

9. A method of fabricating a high voltage integrated circuit structure comprising:
    forming a deep n-well in a substrate;
    forming an n-well within the deep n-well, the n-well extending up to a top surface of the substrate;
    forming a gate electrode overlying said substrate and at least partially overlying said N-well;
    forming a drain high voltage p-well within said substrate;
    implanting source and drain regions within the substrate on opposite sides of, and adjacent to, the gate electrode; and
    forming an isolation region partially underlying an end of said gate electrode on a side of said gate electrode having said drain region, said drain region lying within the drain high voltage p-well,
    wherein said gate electrode overlies and directly contacts a portion of the drain high voltage p-well where the isolation region does not overlie the drain high voltage p-well, and
    the isolation region is located so that the drain high voltage p-well underlies the isolation region entirely.

10. The method of claim 9, wherein the drain region is within said drain high voltage p-well in said drain area.

11. The method of claim 9, wherein:
the n-well is formed within the substrate in a source area containing the source region; and
the isolation region is formed in and on said substrate.

12. The method according to claim 11 wherein a portion of said substrate underlying said gate electrode lies within said n-well.

13. The method according to claim 11 further comprising siliciding said source and drain regions.

14. The method according to claim 11 wherein said isolation region partially underlying said gate electrode lies within said high voltage p-well.

15. The method according to claim 11 wherein said high voltage p-well lies within said deep n-well.

16. The method according to claim 11 wherein a breakdown voltage of said structure occurs at the bottom of said drain region.

17. A symmetrical high voltage integrated circuit structure comprising:
a gate electrode on a substrate;
source and drain regions within said substrate on either side of and adjacent to said gate electrode;
source and drain high voltage p-wells within said substrate, said drain region lying within the drain high voltage p-well, and said source region lying within the source high voltage p-well;
an n-well in said substrate extending up to a top surface thereof, the n-well underlying said gate electrode wherein said n-well does not encompass said source and drain regions; and
a respective isolation region partially underlying both ends of said gate electrode, including a first isolation region partially underlying said gate electrode on said side of said gate electrode having said drain region, and a second isolation region partially underlying said gate electrode on said side of said gate electrode having said source region,
wherein the isolation regions are located so that the drain and source high voltage p-wells underlie the respective first and second isolation regions entirely, and
said gate electrode extends over an entire length of the n-well from an end adjacent the source high voltage p-well to an end adjacent the drain high voltage p-well, said gate electrode overlying portions of the source and drain high voltage p-wells where the isolation regions does not overlie the source and drain high voltage p-wells.

18. The structure according to claim 17 wherein said structure is a high voltage PMOS device.

19. The structure according to claim 17 wherein said source and drain regions are silicided.

20. The structure according to claim 17 further comprising a deep n-well wherein said n-well and said source and drain regions lie within said deep n-well.

21. The structure according to claim 17 wherein a breakdown voltage of said structure occurs at the bottom of said source or drain region.

22. A method of fabricating a high voltage integrated circuit structure comprising:
forming an n-well within a substrate extending up to a top surface thereof, the n-well being formed in a channel area;
forming a high voltage p-well within said substrate in a drain area wherein said drain area is located on one side of said channel region and forming a high voltage p-well within said substrate in a source area wherein said source area is located on another side of said channel region;
forming isolation regions in and on said substrate, wherein the isolation regions are located so that the high voltage p-wells underlie the respective isolation region entirely;
forming a gate electrode overlying said substrate and one of said isolation regions at either end and overlying said channel area, said gate electrode extending over an entire length of the n-well from an end adjacent the source high voltage p-well to an end adjacent the drain high voltage p-well, said gate electrode overlying portions of the source and drain high voltage p-wells where the isolation regions does not overlie the source and drain high voltage p-wells;
implanting a source region within said high voltage p-well in said source area adjacent to said gate electrode; and
implanting a drain region within said high voltage p-well in said drain area adjacent to said gate electrode to complete said fabrication of said high voltage integrated circuit structure.

23. The method according to claim 22 further comprising siliciding said source and drain regions.

24. The method according to claim 22 wherein each of said isolation regions partially underlying said gate electrode lies within one of said high voltage p-wells.

25. The method according to claim 22 further comprising forming a deep n-well wherein said n-well and said high voltage p-wells lie within said deep n-well.

26. The method according to claim 22 wherein a breakdown voltage of said structure is located at the bottom of said source or drain region.

* * * * *